(12) United States Patent
Jurzitza

(10) Patent No.: US 9,344,053 B2
(45) Date of Patent: May 17, 2016

(54) OUTPUT STAGE FOR ADAPTING AN AC VOLTAGE SIGNAL OF AN ULTRASOUND GENERATOR

(71) Applicant: Herrmann Ultraschalltechnik GmbH & Co. KG, Karlsbad (DE)

(72) Inventor: Dieter Jurzitza, Karlsruhe (DE)

(73) Assignee: Herrmann Ultraschalltechnik GmbH & Co. KG, Karlsbad (DE)

( * ) Notice: Subject to any disclaimer, the term of this patent is extended or adjusted under 35 U.S.C. 154(b) by 0 days.

(21) Appl. No.: 14/405,327

(22) PCT Filed: Jul. 10, 2013

(86) PCT No.: PCT/EP2013/064626
§ 371 (c)(1),
(2) Date: Dec. 3, 2014

(87) PCT Pub. No.: WO2014/012834
PCT Pub. Date: Jan. 23, 2014

(65) Prior Publication Data
US 2015/0162887 A1    Jun. 11, 2015

(30) Foreign Application Priority Data

Jul. 16, 2012 (DE) .......................... 10 2012 106 382

(51) Int. Cl.
*B32B 37/00* (2006.01)
*H03H 7/01* (2006.01)
(Continued)

(52) U.S. Cl.
CPC ............ *H03H 7/0115* (2013.01); *B06B 1/0207* (2013.01); *B06B 1/0253* (2013.01);
(Continued)

(58) Field of Classification Search
CPC .... H03H 7/0115; H03H 7/425; B06B 1/0207; B06B 1/0253; B23K 20/12; G01R 19/10; H01M 1/126; B29C 65/08
USPC .............................. 156/64, 73.1, 580.1, 580.2
See application file for complete search history.

(56) References Cited

U.S. PATENT DOCUMENTS 3,666,599 A * 5/1972 Obeda ................... B29C 65/086
                                                    156/538
4,626,728 A    12/1986 Flachenecker et al.
(Continued)

FOREIGN PATENT DOCUMENTS

CH         272868 A    1/1951
DE       2357154 A1    5/1974
(Continued)

*Primary Examiner* — James Sells
(74) *Attorney, Agent, or Firm* — Paul & Paul

(57) ABSTRACT

The present invention relates to an output stage for adapting an AC voltage signal of an ultrasound generator to a converter connectable to the output stage, wherein the output stage has two input terminals for receiving the AC voltage produced by the ultrasound generator and two output terminals for outputting an adapted AC voltage, as well as an output transformer with a primary coil having a number $n_1$ turns and a secondary coil with a number $n_2$ turns, the output transformer having a main inductance $L_H$ as well as a leakage inductance $L_\sigma$, the two input terminals being connected to one another via the primary coil and the two output terminals being connected to one another via the secondary coil. In order to disclose an output transformer, which allows an economical and uncomplicated adaptation of a generator output to the converter input, it is proposed according to the invention that a filter capacitor $C_P$ is provided, which either connects the two output terminals in parallel to the secondary coil or connects an output terminal to a tap of the secondary coil or is connected to a filter coil with $n_3$ turns, which is inductively coupled to the primary and the secondary coil.

19 Claims, 4 Drawing Sheets

(51) Int. Cl.
*G01R 19/10* (2006.01)
*B06B 1/02* (2006.01)
*H02M 1/12* (2006.01)
*H03H 7/42* (2006.01)
*B23K 20/10* (2006.01)
*B29C 65/08* (2006.01)
*G01R 15/18* (2006.01)
*B29L 9/00* (2006.01)

(52) U.S. Cl.
CPC ............... *B23K 20/10* (2013.01); *B29C 65/08* (2013.01); *G01R 19/10* (2013.01); *H02M 1/126* (2013.01); *H03H 7/425* (2013.01); *B06B 2201/72* (2013.01); *B29L 2009/00* (2013.01); *G01R 15/185* (2013.01); *H03H 7/1775* (2013.01)

(56) References Cited

U.S. PATENT DOCUMENTS

| | | | | |
|---|---|---|---|---|
| 4,746,051 A * | 5/1988 | Peter | ............... | B23K 31/125 228/1.1 |
| 5,394,047 A | 2/1995 | Scharlack et al. | | |
| 5,880,580 A * | 3/1999 | Johansen | ............... | B23K 20/10 156/73.1 |
| 5,912,553 A | 6/1999 | Mengelkoch | | |
| 6,036,796 A * | 3/2000 | Halbert | ............... | B06B 1/0223 156/351 |
| 7,225,965 B2 * | 6/2007 | Johansen | ............... | B23K 20/10 156/73.1 |
| 2003/0001456 A1 | 1/2003 | Kauf et al. | | |
| 2011/0205838 A1 | 8/2011 | Beckers et al. | | |
| 2014/0083623 A1 | 3/2014 | Jurzitza | | |
| 2014/0157899 A1 | 6/2014 | Jurzitza | | |

FOREIGN PATENT DOCUMENTS

| | | |
|---|---|---|
| DE | 3331896 A1 | 3/1985 |
| DE | 102006056095 A1 | 5/2008 |
| EP | 1157752 A2 | 11/2001 |
| FR | 2207340 A1 | 6/1974 |
| JP | H11332218 A | 11/1999 |
| WO | 2012163919 A2 | 12/2012 |
| WO | 2013017452 A2 | 2/2013 |

* cited by examiner

OUTPUT STAGE FOR ADAPTING AN AC VOLTAGE SIGNAL OF AN ULTRASOUND GENERATOR

CROSS-REFERENCE TO RELATED APPLICATION

This application is national stage 371 application of International Patent Application PCT/EP2013/064626, filed Jul. 10, 2013, which claims the priority of German Application No. 10 2012 106 382.6, filed on Jul. 16. 2012.

The present invention relates to an output stage for adapting an output signal of an ultrasound generator to a converter of an ultrasound oscillating unit.

Ultrasound generators are known and are used, for example, to drive an ultrasound oscillating unit. Typical ultrasound oscillating units consist of a converter and a sonotrode optionally connected thereto via an amplitude transformer. The ultrasound generator is used to produce a corresponding AC voltage or AC signal, which is converted by the converter into a mechanical oscillation, with which the ultrasound oscillating unit oscillates.

An ultrasound oscillating unit of this type may, for example, be used for ultrasonic welding. It is important here for the ultrasound oscillating unit to be excited at its resonance frequency.

The ultrasound generator consequently has to be in a position to produce a corresponding AC signal. Therefore, the ultrasound generator and converter of the ultrasound oscillating unit have to be matched to one another. An output stage, which can be connected to the ultrasound generator or can even be integrated in the generator housing, is used for this matching. Integration into the converter would basically also be conceivable.

The core of the output stage is an output transformer, i.e. the output stage has two input terminals to receive the AC voltage produced by the ultrasound generator and two output terminals to output an adapted AC voltage as well as an output transformer with a primary coil with a number $n_1$ turns and a secondary coil with a number $n_2$ turns, the two input terminals being connected to one another via the primary coil and the two output terminals being connected to one another via the secondary coil.

Generally, output transformers, the single function of which is to carry out the described adaptation, are used in conventional ultrasound generators.

However, output stages have further inductive power components. These are used both for compensation purposes, in order, for example, to be able to derive a variable proportional to the oscillation amplitude so a control or regulation of the oscillation amplitude can take place, and to filter the output signal of the output stage.

An arrangement of an output stage of the prior art is shown in FIG. 1. The output stage has two input terminals 1, 2, to which the AC voltage produced by the generator is applied.

The primary coil $N_P$ and the secondary coil $N_S$ form an ideal transformer. The two output terminals 3, 4 supply the output voltage, which is then applied to the converter 7 of the ultrasound oscillating unit. The actual adaptation function is fulfilled by the ideal transformer.

A simplified replacement circuit diagram of the real transformer is reproduced in the box shown by dashed lines. Accordingly, the transformer consists of an ideal transformer and a main inductance $L_H$. The main inductance $L_H$, apart from a slight leakage, corresponds to the inductance of the primary coil.

Additionally arranged here in parallel to the primary coil is a filter capacitor $C_P$, which, together with the filter inductor $L_P$, is used to filter the typically rectangular output signal of the generator. Both the filter capacitor and the filter inductor may be arranged in the generator or in the output stage. Basically, the real transformer also has a leakage inductance $L_\sigma$. This is an inherent property of every real transformer that is effective at each pair of terminals. It is an additional inductance that has to be conceived to be connected in series with each individual turn inductance. It is not inductively coupled with the other turns of the observed transformer. Rather, it has to be conceived as limited with respect to its effectiveness to the respectively observed pair of terminals.

This leakage inductance, in the transformers observed here, has an order of magnitude of about 1% to 2% of the respective main inductance of the observed turn. In the prior art, it is therefore significantly smaller than the filter inductance $L_P$ and can therefore be ignored.

As the converter 7 to be connected to the output terminals 3, 4 has an intrinsic converter capacitance, a corresponding compensation inductor $L_A$ is generally arranged in parallel with the electric converter in the converter or in the output transformer.

For filtering and compensation, the inductor $L_P$ and the capacitor $C_P$ are thus used on the generator side and the compensation inductor $L_A$ is used on the converter side.

These additional elements increase the cost of the structure and require additional installation space.

It is therefore the object of the present invention to disclose an output transformer, which allows an economical and uncomplicated adaptation of a generator output to the converter input.

This object is achieved according to the invention in that a filter capacitor $C_P$ is provided, which either connects the two output terminals parallel to the secondary coil or connects an output terminal to a tap of the secondary coil or is connected to a filter coil with $n_3$ turns, which is inductively coupled to the primary and the secondary coil.

Basically, the present invention is based on the knowledge that the output transformer can be adjusted in such a way that its leakage inductance takes on the role of the filter inductor $L_P$, so providing the filter inductor $L_P$ separately can be dispensed with.

FIG. 2 shows an extended replacement circuit diagram of an output transformer. The output transformer can be shown by an ideal transformer T with a corresponding transformation ratio Ü. The main inductance $L_H$, which substantially corresponds to the inductance of the primary coil, is located parallel to the primary coil $N_P$. The inductance $L_\sigma$ that is drawn in represents the leakage inductance. The leakage inductance $L_\sigma$ is to comprise both the leakage inductance of the primary coil and the leakage inductance of the secondary coil in the example shown. As already stated, the leakage inductance is normally small, so it can be ignored.

By suitable dimensioning of the output transformer, the leakage inductance $L_\sigma$ can now be adjusted in such a way that it corresponds to the desired filter inductor $L_P$, which can thus be dispensed with.

However, it is obvious that the desired filter capacitor $C_P$ cannot be arranged at the points 5 and 6 shown in FIG. 2, i.e. parallel to the inductance $L_H$, as the inductances $L_H$ and $L_\sigma$ are not real components, but merely elements of the replacement circuit diagram and therefore intrinsic properties of the real output transformer. Basically, the replacement circuit diagram shown in the dashed box represents a single element.

According to the invention, the filter capacitor $C_P$ is not now provided on the primary side but on the secondary side.

For example, as shown in FIG. 3, the secondary coil may have a tap 10, so the filter capacitor $C_P$ can be connected between the tap 10 and output terminal 4. The arrangement of the filter capacitor $C_P$ on the secondary side ultimately leads to the same behaviour of the output transformer as shown in FIG. 1, but with the function of the separate filter inductor $L_P$ now being taken on by the leakage inductance $L_\sigma$ deliberately adjusted to be greater according to the invention and present in any case. A physical component can thereby be saved.

It should be mentioned at this point that the turn capacitance of the output transformer is not taken into account in the consideration. However, this is justified as the filter capacitance $C_P$ is many times greater than the turn capacitance.

It is generally helpful if the current $I_T$, i.e. the current flowing through the output transformer, is measured, as it represents a measure of the oscillation amplitude of the ultrasound oscillating unit. In the known embodiment shown in FIG. 1, this current can easily be measured. There applies $I_E = I_T + I_C$. In other words, the current fed at the input terminals 1, 2 is divided into a current through the output transformer $I_T$ and the current $I_C$ via the filter capacitor $C_P$. In the solution provided according to the invention, in which the filter inductor $L_P$ is realised by the leakage inductance $L_\sigma$, the current $I_T$ can, however, no longer be directly measured.

It is therefore provided according to the invention that a device for measuring the differential current $I_\Delta$ of the current $I_E$ flowing via the input terminals and the current $I_C$ is provided by the filter capacitor $C_P$. In other words, the current flowing through the filter capacitor $C_P$ provided on the secondary side is deducted from the input current $I_E$. The differential current $I_\Delta$ corresponds, however, to the current $I_T$.

This differential measurement may, for example, take place with the aid of an inductive current measuring transformer, through which is guided both a line, through which the current $I_E$ flowing via the input terminal flows, and a line, through which the current $I_C$ flows through the filter capacitor $C_P$. It is obvious that the corresponding lines have to have an opposite flow through them in order to ensure the differential.

If the ratio n1 to n2 equals 1, the filter capacitor $C_P$ is arranged in a preferred embodiment in such a way that it connects the two output terminals 3, 4 in parallel to the secondary coil and $C_P$ bridges n1 turns.

If n1 to n2 is greater than 1, the turn n2 is additionally lengthened in a preferred embodiment, so a further tap is produced at n1 turns on the secondary side. One side of $C_P$ is then connected to this tap 10, so $C_P$ bridges n1 turns on the secondary side.

If the ratio n1 to n2 is smaller than 1, the filter capacitor $C_P$ is arranged in one embodiment in such a way that it connects an output terminal to a tap of the secondary side, the tap being arranged after n1 turns and the capacitor $C_P$ thus bridging n1 turns on the secondary side.

As an alternative to this it would also be possible for the filter capacitor $C_P$ to be connected to a filter coil with $n_3$ turns, wherein $n_3 = n_1$. This filter coil then has to be inductively coupled to the primary and secondary coil.

This again ensures that the capacitance 1:1 is transferred from the primary side to the secondary side and, in a complete analogy to FIG. 1, forms the required parallel capacitor $C_P$ to the main inductance $L_H$.

These preferred embodiments make it particularly simple to realise the described differential of the current. In other transformation ratios for the connection of $C_P$ it is conceivable to deduct the multiple of the current through $C_P$ from the current $I_E$ to achieve the same result. With a preferred embodiment, this could be realised by repeatedly guiding the wire carrying the current through $C_P$ through the inductive current measuring transformer. The value of $C_P$ should then be suitably adapted in accordance with the transformation ratio and the leakage inductance being produced.

The present invention furthermore relates to an ultrasonic welding arrangement with an ultrasound oscillating unit, an ultrasound generator and the output stage according to the invention, the ultrasound oscillating unit having a transformer for transforming an electric alternating current into a mechanical oscillation. It is then provided in a preferred embodiment that the ultrasound generator is configured to produce an electric signal with the frequency f, that the converter has a converter capacitance $C_K$ and that the main inductance $L_H$ is selected in such a way that the main inductance together with the converter capacitance forms a blocking circuit, the blocking frequency $f_S$ of which substantially corresponds to the frequency f.

As an alternative or in combination with this, the filter capacitor $C_P$ is selected in such a way that $$\frac{1}{2\pi C_P L_\sigma}$$

is between 1.5 times and 2.5 times the frequency f.

In other words, not only does the leakage inductance $L_\sigma$ take on the function of the filter inductor $L_P$ generally arranged on the primary side, but the main inductance $L_H$ also takes on the function of the compensation inductor $L_A$, which is provided on the secondary side in the converter.

Two inductors can be saved in the generator by this arrangement.

Further advantages, features and application possibilities of the present invention become clear with the aid of the following description of a preferred embodiment and the associated figures, in which:

FIG. 1 shows a circuit plan of a generator output stage of the prior art. The construction has already been described in the introduction.

FIG. 2 shows a replacement circuit diagram of an output transformer without inductive or capacitive power components. The construction was already described in the introduction to the description.

Figure 1:
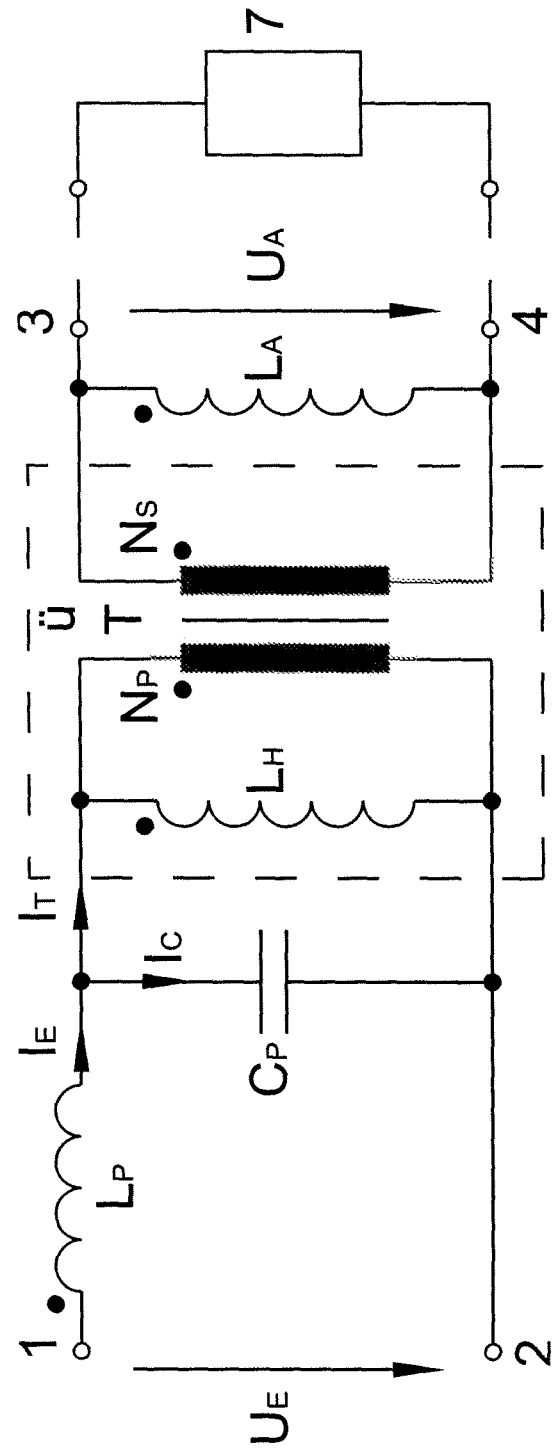
FIG. 1 shows an output transformer of the prior art.
Figure 2:
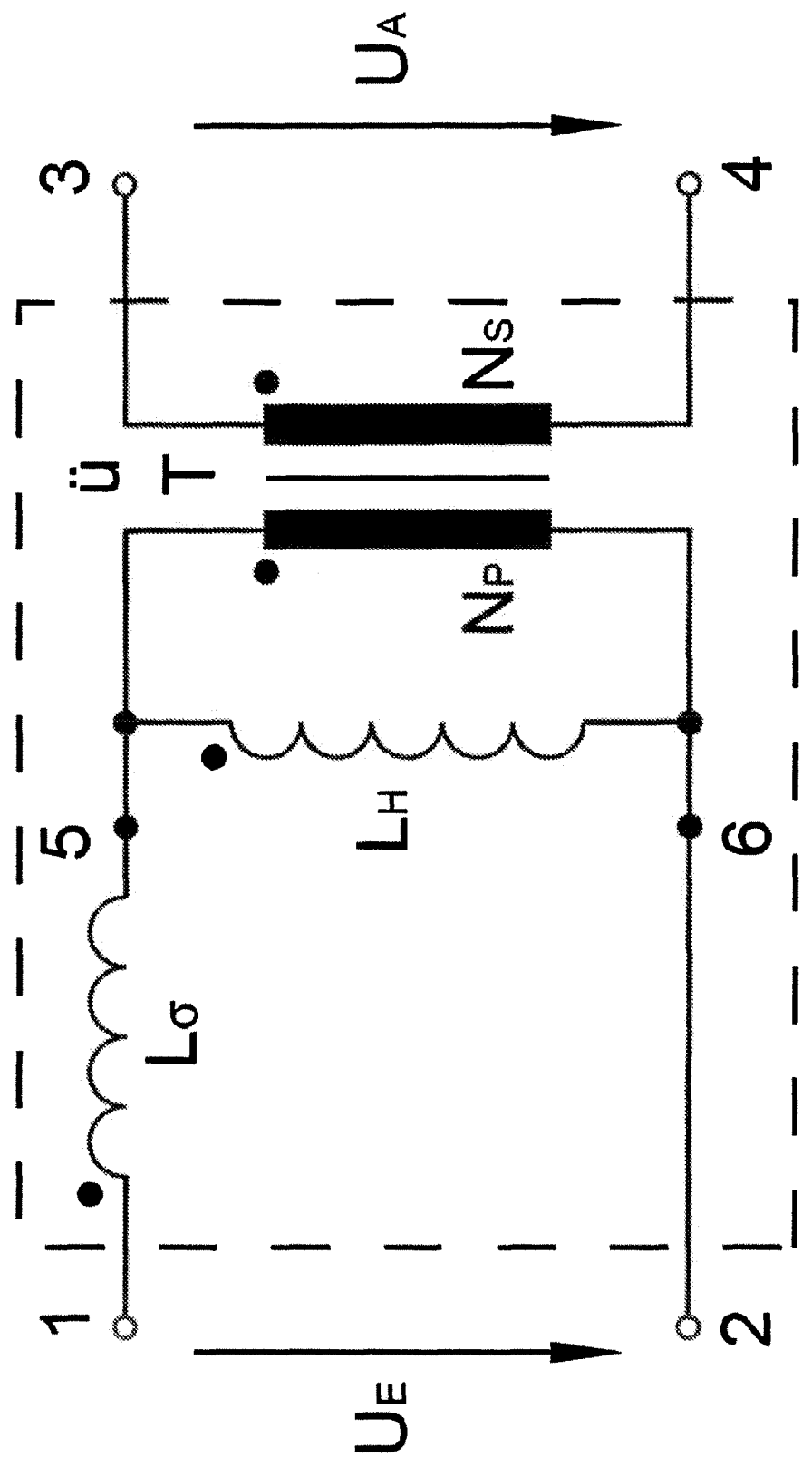
FIG. 2 shows a replacement circuit diagram of a transformer.
Figure 3:
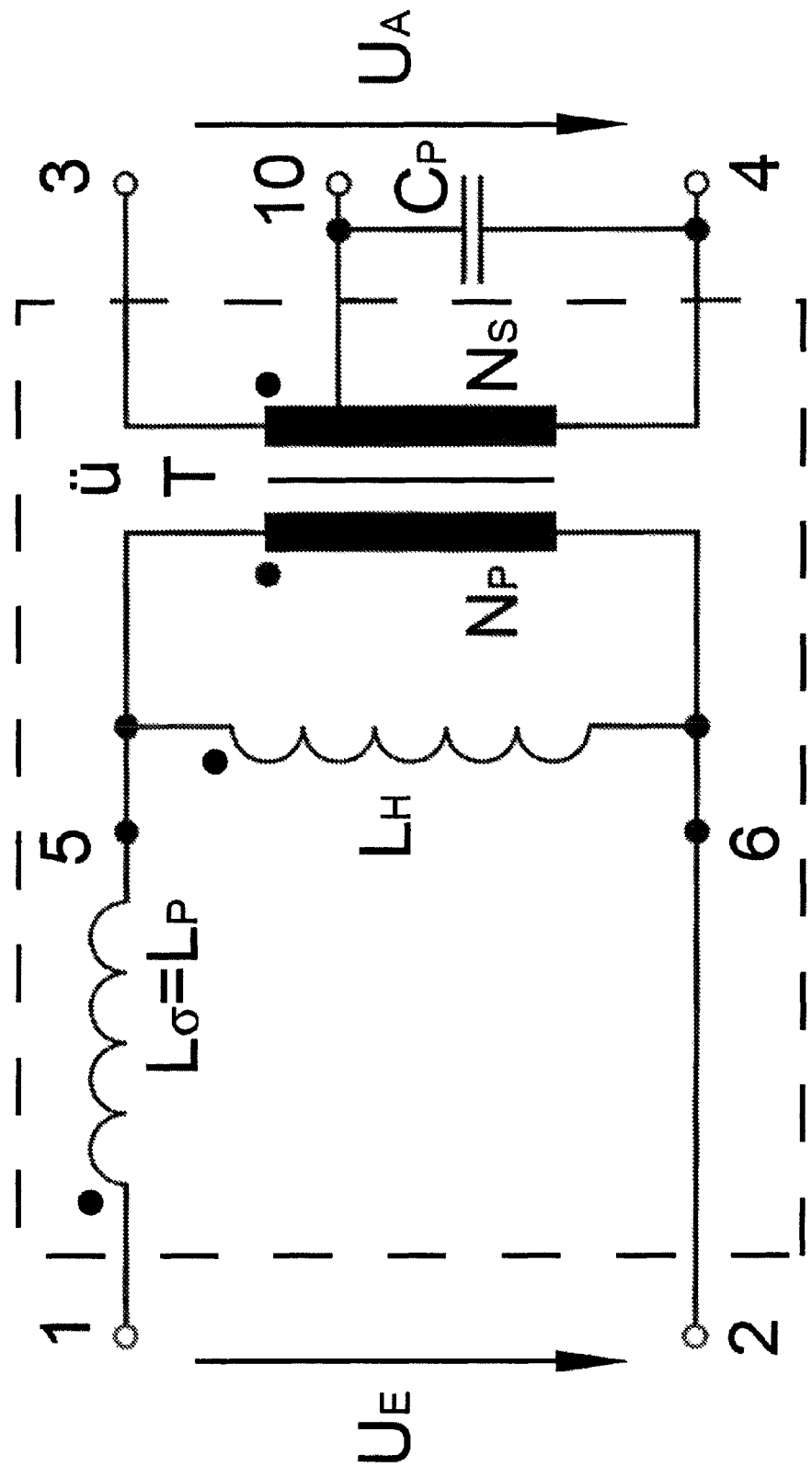
FIG. 3 shows an embodiment of the invention.

FIG. 3 shows a first embodiment of the invention. The replacement circuit diagram of the output transformer is shown. This replacement circuit diagram substantially corresponds to the image of FIG. 2, but the main inductance $L_H$ and the leakage inductance $L_\sigma$ have been varied in such a way that the main inductance $L_H$ adopts a value, which coincides with the compensation inductor $L_A$, which is generally used in the converter. By means of this measure, the use of a separate inductance in the converter can be dispensed with. Furthermore, the leakage inductance $L_\sigma$ has been selected in such a way that it corresponds to the filter inductor $L_P$ of FIG. 1, so the filter inductor can also be dispensed with. As the filter inductor $L_P$ in the embodiment shown is realised by the leakage inductance $L_\sigma$, the filter capacitor $C_P$ cannot be arranged in the position shown in FIG. 1, as a corresponding tap is not available.

Therefore, it is proposed according to the invention to arrange the filter capacitor $C_P$ on the secondary side, as shown in FIG. 3. In the embodiment shown, the coil $N_S$ on the secondary side has a tap $N_P$, so the filter capacitor $C_P$ connects the tap 10 to an output terminal 4. The tap 10, in the embodiment shown, is arranged at a turn number corresponding to the turn number of the primary coil.

Figure 4:
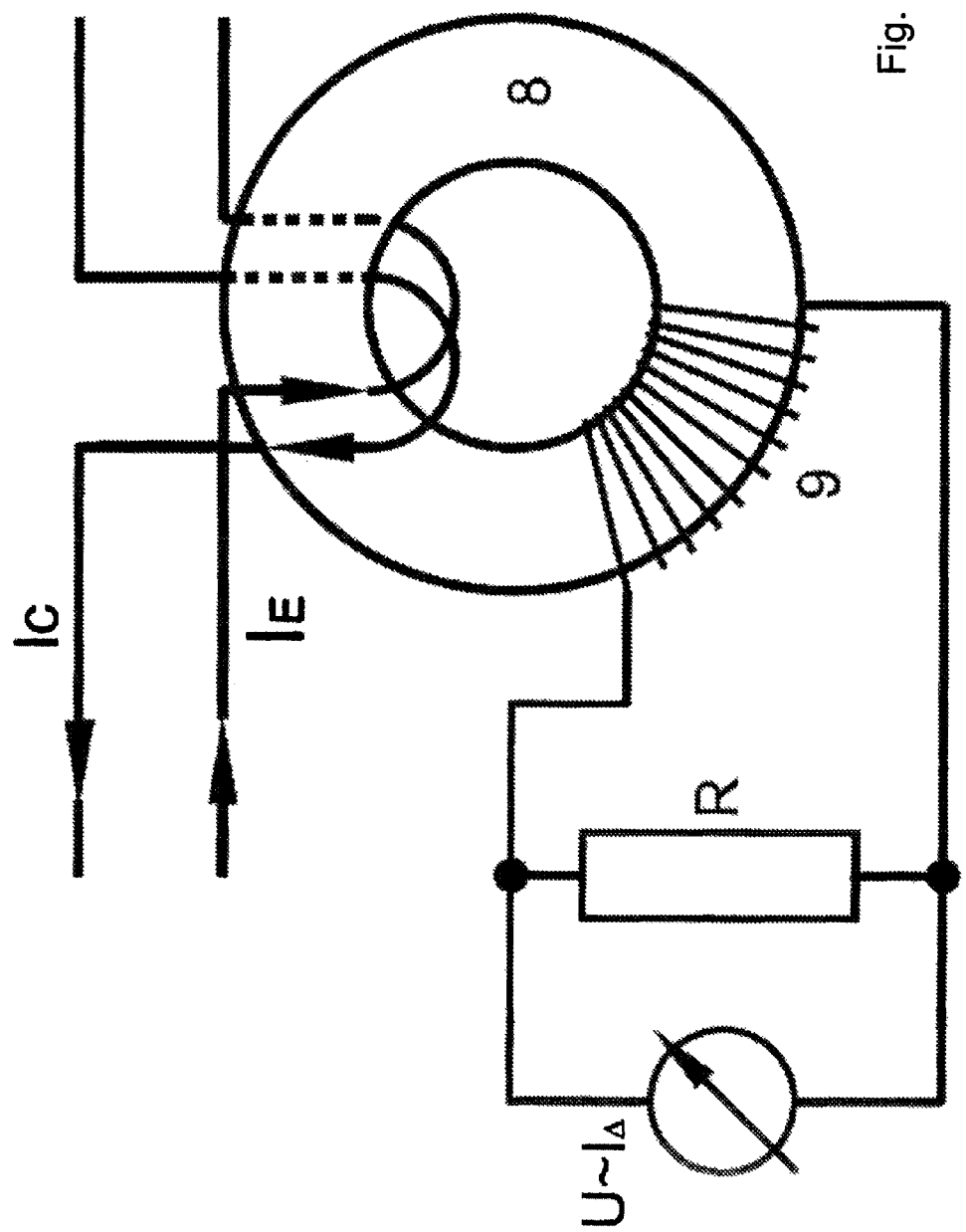
FIG. 4 shows an embodiment of a current measuring device.

In order to now measure the current, which is proportional to the oscillation amplitude of the ultrasound oscillating unit, an inductive current measuring transformer 8, 9 is used, as shown in FIG. 4. This inductive current measuring transformer is inserted between the filter capacitor $C_P$ and the main inductance. The current measuring transformer consists of a small toroidal core transformer, in which the current to be measured is guided through a hole in the core 8. As can be seen in FIG. 4, both the capacitance current $I_C$ flowing through the filter capacitor $C_P$ and the overall input current $I_E$ are guided through the current measuring transformer, but with a reversed sign, so the difference between the two values, which is proportional to the oscillation amplitude, can be measured with the aid of the arrangement.

LIST OF REFERENCE NUMERALS 1, 2 input terminals
3, 4 output terminals
5, 6 points
7 converter
8 core of the current measuring transformer
9 coil of the current measuring transformer
10 tap
$N_P$ primary coil
$N_S$ secondary coil
$C_P$ filter capacitor, capacitor
$L_A$ compensation inductor
$L_H$ main inductance
$L_\sigma$ leakage inductance
$L_P$ filter inductor
$I_T$ transformer current
$I_E$ input current
$I_C$ capacitance current

The invention claimed is:

1. Output stage for adapting an AC voltage signal of an ultrasound generator to a converter connectable to the output stage, wherein the output stage has two input terminals for receiving the AC voltage produced by the ultrasound generator and two output terminals for outputting an adapted AC voltage, as well as an output transformer with a primary coil having a number $n_1$ turns and a secondary coil with a number $n_2$ turns, the output transformer having a main inductance $L_H$ as well as a leakage inductance $L_\sigma$, the two input terminals being connected to one another via the primary coil and the two output terminals being connected to one another via the secondary coil, characterised in that a filter capacitor $C_p$ is provided, which either connects the two output terminals in parallel to the secondary coil or connects an output terminal to a tap of the secondary coil or is connected to a filter coil with $n_3$ turns, which is inductively coupled to the primary and the secondary coil, whereas a device is provided for measuring the differential current $I_A$ of the current $I_E$ flowing via the input terminals and the current $I_c$ through the filter capacitor $C_p$.

2. Output stage according to claim 1, characterised in that an inductive current measuring transformer is used as the device for measuring the differential current $I_A$, through which are guided both a line, through which the current $I_E$ flowing via the input terminals flows, and a line, through which the current $I_c$ flows through the filter capacitor $C_p$.

3. Output stage according to claim 1, characterised in that the ratio $n_1$ to $n_2$ is equal to one $$\left(\frac{n_1}{n_2} = 1\right)$$

and the filter capacitor $C_p$ is arranged in such a way that it connects the two output terminals in parallel to the secondary coil.

4. Output stage according to claim 1, characterised in that the ratio $n_1$ to $n_2$ is greater than one $$\left(\frac{n_1}{n_2} > 1\right)$$

and the filter capacitor $C_p$ is arranged in such a way that it is connected to an extension turn $n_3$ of the secondary coil, to which there applies $$\left(\frac{n_1}{n_3} = 1\right).$$

5. Output stage according to claim 1, characterised in that ratio $n_1$ to $n_2$ is less than one $$\left(\frac{n_1}{n_2} < 1\right)$$

and the filter capacitor $C_p$ is arranged in such a way that it connects an output terminal to a tap of the secondary coil, wherein the tap is arranged after $n_1$ turns.

6. Output stage according to claim 1, characterised in that the filter capacitor $C_p$ is connected to a filter coil with $n_3$ turns, which is inductively coupled to the output transformer, wherein there applies $n_3 = n_1$.

7. Ultrasonic welding arrangement with an ultrasound oscillating unit, an ultrasound generator and an output stage according to claim 1, characterised in that the ultrasound oscillating unit has a transformer for converting an electric alternating current into a mechanical oscillation, and the ultrasound generator is configured to produce an electric signal of the frequency f.

8. Ultrasonic welding arrangement according to claim 7, characterised in that the converter has a converter capacitance $C_K$ and in that the main inductance $L_H$ of the output transformer is selected in such a way that the main inductance together with the converter capacitance forms a blocking circuit, the blocking frequency $f_s$ of which substantially corresponds to f.

9. Ultrasonic welding arrangement according to claim 7, characterised in that the filter capacitor $C_p$ is selected in such a way that $$\frac{1}{2\pi C_p L_\sigma}$$

is between 1.5 times and 2.5 times the frequency f.

10. Ultrasonic welding arrangement according to claim 8, characterised in that the filter capacitor $C_p$ is selected in such a way that $$\frac{1}{2\pi C_p L_\sigma}$$

is between 1.5 times and 2.5 times the frequency f.

11. Output stage according to claim 2, characterised in that the ratio $n_1$ to $n_2$ is equal to one $$\left(\frac{n_1}{n_2} = 1\right)$$

and the filter capacitor $C_p$ is arranged in such a way that it connects the two output terminals in parallel to the secondary coil.

12. Output stage according to claim 2, characterised in that the ratio $n_1$ to $n_2$ is greater than one $$\left(\frac{n_1}{n_2} > 1\right)$$

and the filter capacitor $C_p$ is arranged in such a way that it is connected to an extension turn $n_3$ of the secondary coil, to which there applies $$\left(\frac{n_1}{n_3} = 1\right).$$

13. Output stage according to claim 2, characterised in that ratio $n_1$ to $n_2$ is less than one $$\left(\frac{n_1}{n_2} < 1\right)$$

and the filter capacitor $C_p$ is arranged in such a way that it connects an output terminal to a tap of the secondary coil, wherein the tap is arranged after $n_1$ turns.

14. Output stage according to claim 2, characterised in that the filter capacitor $C_p$ is connected to a filter coil with $n_3$ turns, which is inductively coupled to the output transformer, wherein there applies $n_3 = n_1$.

15. Ultrasonic welding arrangement with an ultrasound oscillating unit, an ultrasound generator and an output stage according to claim 2, characterised in that the ultrasound oscillating unit has a transformer for converting an electric alternating current into a mechanical oscillation, and the ultrasound generator is configured to produce an electric signal of the frequency f.

16. Ultrasonic welding arrangement with an ultrasound oscillating unit, an ultrasound generator and an output stage according to claim 3, characterised in that the ultrasound oscillating unit has a transformer for converting an electric alternating current into a mechanical oscillation, and the ultrasound generator is configured to produce an electric signal of the frequency f.

17. Ultrasonic welding arrangement with an ultrasound oscillating unit, an ultrasound generator and an output stage according to claim 4, characterised in that the ultrasound oscillating unit has a transformer for converting an electric alternating current into a mechanical oscillation, and the ultrasound generator is configured to produce an electric signal of the frequency f.

18. Ultrasonic welding arrangement with an ultrasound oscillating unit, an ultrasound generator and an output stage according to claim 5, characterised in that the ultrasound oscillating unit has a transformer for converting an electric alternating current into a mechanical oscillation, and the ultrasound generator is configured to produce an electric signal of the frequency f.

19. Ultrasonic welding arrangement with an ultrasound oscillating unit, an ultrasound generator and an output stage according to claim 6, characterised in that the ultrasound oscillating unit has a transformer for converting an electric alternating current into a mechanical oscillation, and the ultrasound generator is configured to produce an electric signal of the frequency f.

* * * * *